BLOCKING OSCILLATOR WITH DELAY MEANS IN FEEDBACK LOOP

Filed Sept. 22, 1959

INVENTOR.
ALAN H. NELSON
BY John A. Duffy
AGENT

United States Patent Office 3,158,751
Patented Nov. 24, 1964

3,158,751
BLOCKING OSCILLATOR WITH DELAY MEANS IN FEEDBACK LOOP

Alan H. Nelson, Downey, Calif., assignor to North American Aviation, Inc.
Filed Sept. 22, 1959, Ser. No. 841,597
9 Claims. (Cl. 307—88.5)

Figure 1:
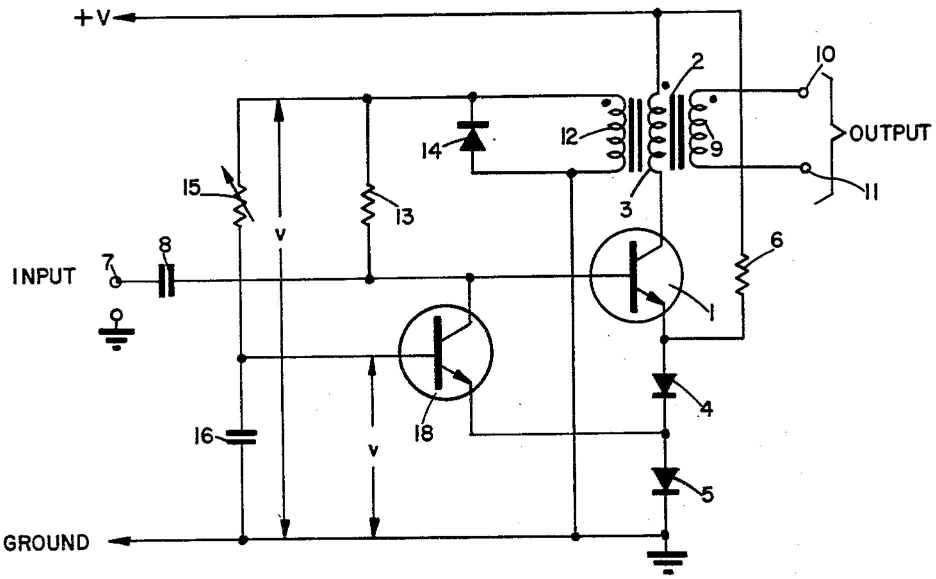

This invention relates to blocking oscillators and more particularly to a single swing transistorized blocking oscillator whose output pulse is controlled in width by a circuit independent of the oscillator portion of the circuit.

The continuing trend toward more accurate and versatile electronic circuits, especially in the guided missile field, has dictated a need for more accurate pulse forming circuits. In particular, a circuit is needed for generating a pulse of uniform predictable width with means in the circuit for varying the width of the pulse.

Blocking oscillator circuits used as low impedance pulse generators for triggering and switching are well known. A blocking oscillator is a high frequency sine wave oscillator in which the control electrode is driven positive during half of the cycle. A single swing blocking oscillator provides a single output pulse in response to a triggering pulse applied to the control electrode of the oscillator tube. Blocking oscillators known in the art are not precision devices and the characteristics of the output pulse are influenced markedly by the circuit characteristics of the oscillator tube utilized; the residual magnetism in the transformer core, and the age and condition of the oscillator tube. The operating tube characteristics are nonlinear and the inductances of the windings of the pulse transformer are not only nonlinear but also dependent on the duration and spacing of the error core utilized. Therefore, the width of the output pulse varies considerably prohibiting the use of a blocking oscillator for applications where precision is desired in the pulse output characteristics.

The device of this invention makes possible the generation of pulses of precision uniform and predictable width by providing a blocking oscillator circuit in which the width of the output pulse is determined by circuitry independent of the transformer and oscillator tube of the blocking oscillator. A wide range of pulse widths of uniform predictable width is realized for a single transformer and oscillator tube of the blocking oscillator. By providing a blocking oscillator circuit whose pulse width is independent of transformer and oscillator tube characteristics the device of this invention provides a precision blocking oscillator.

It is therefore an object of this invention to provide an improved blocking oscillator.

It is another object of this invention to provide a pulse generator with improved control over the output pulse characteristics.

It is still another object of this invention to provide a blocking oscillator whose output pulse is controllable in width.

It is a further object of this invention to provide a blocking oscillator with independent means for controlling the width of the output pulse therefrom.

It is a still further object of this invention to provide a blocking oscillator for generating pulses of uniform predictable width.

It is still another object of this invention to provide a single stage blocking oscillator which produces an output pulse whose width is determined by circuitry independent of the oscillator tube and transformer associated therewith.

Figure 2:
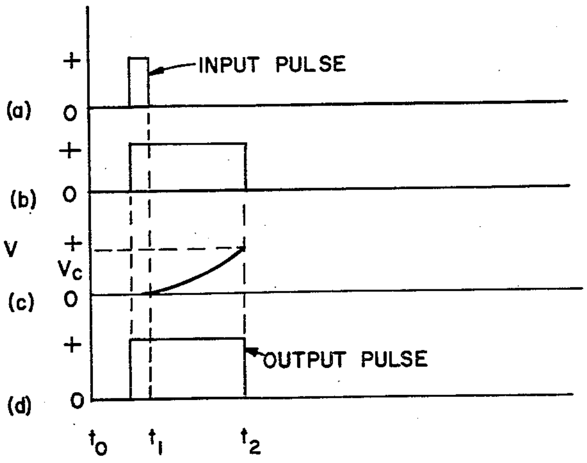

Other objects of invention will become apparent from the following description taken in connection with the accompanying drawings in which FIG. 1 is a schematic diagram of the preferred embodiment of the invention; and FIG. 2 illustrates the waveform characteristics of the circuit of FIG. 1.

According to one aspect of applicant's invention, there is provided a blocking oscillator comprising an electron valve having a first, or cathode electrode, a second, or anode electrode, and a control electrode. The control electrode is connected to be responsive to input trigger pulses for initiating conduction in the electron valve. A transformer has a primary winding connected to the second electrode of the valve and a secondary winding conductively coupled to the primary winding. A first current path, including a resistor for coupling the secondary winding to the control electrode is provided to feed back to the control electrode at least a portion of the voltage developed across the primary winding for maintaining conduction in the electron valve. There is also included a second current path for connecting the secondary winding to the control electrode for cutting off conduction in the electron valve. The second current path comprises a second electron valve having a first and second electrode and a control electrode with the second electrode being connected to the control electrode of the first electron valve, and the first electrode being connected to the first electrode of the first electron valve. The control electrode of the second electron valve is responsive to the voltage developed across the secondary winding for terminating conduction in the first electron valve. Included in the second current path is a resistor-capacitor circuit which is responsive to the voltage developed in the secondary winding with the control electrode of the second electron valve being responsive to the resistor-capacitor circuit.

Referring to FIG. 1 of the drawings there is illustrated NPN transistor 1 and transformer 2 which combine to form a single swing blocking oscillator. Transistor 1 may be of the NPN type having its collector connected through primary winding 3 of transformer 2 to a B+ potential. The emitter of transistor 1 is connected through diodes 4 and 5 in series to ground and also through resistor 6 to B+ to establish a quiescent bias potential. The base of transistor 1 is connected to receive positive input pulses from terminal 7 coupled through input capacitor 8. Secondary winding 9 of transformer 2 is connected to present output pulses of the blocking oscillator at terminals 10 and 11.

Feedback winding 12 of transformer 2 feeds back a portion of the output voltage across transformer 2 through resistor 13 to the base of transistor 1 in order to maintain transistor 1 conducting after initiation of blocking oscillator action by input pulses through terminal 7. One terminal of winding 12 is connected in series with resistor 13 to the base of transistor 1 and the other terminal is connected to ground. Diode 14 is connected across winding 12 to provide stability of action preventing overshoot of the feedback potential from winding 12 to the base of transistor 1.

Feedback winding 12 is also connected through a resistor-capacitor circuit comprising variable resistor 15 and capacitor 16 to feed back a portion of the output voltage to the base of control transistor 18. One side of secondary winding 12 is connected in series through resistor 15 and capacitor 16 to ground, with the common junction of capacitor 16 and resistor 15 connected to the base of transistor 18. Transistor 18, of the NPN type, has its collector connected to the base of transistor 1 and its emitter connected to the junction of diodes 4 and 5. Transistor 18 is normally cut off during operation of the blocking oscillator when transistor 1 is conducting. Upon receipt of a feedback potential from winding 12 after a time determined by the characteristics of the resistor-capacitor circuit, transistor 18 conducts, cutting off transistor 1.

Polarity dots illustrated in FIG. 1 indicate the relative polarities of the windings of transformer 2.

In operation the circuit shown operates as a single swing blocking oscillator. Before an input pulse is received, transistor 1 is cut off and no output is present across terminals 10 and 11. A positive trigger pulse applied to the base of transistor 1 from input terminal 7 causes transistor 1 to conduct. Current flowing in the collector circuit of transistor 1 and through primary winding 3 of transformer 2 induces a voltage across secondary winding 9 which is connected to output terminals 10 and 11. The voltage induced in feedback winding 12 by transformer 2 is fed back to the base of transistor 1 through resistor 13, maintaining transistor 1 on after the input pulse terminates. Thus, upon application of an input pulse to the base of transistor 1, current in primary winding 3 of transformer 2 induces a voltage across output terminals 10 and 11.

So far in the operation of the circuit shown there has been described a single swing blocking oscillator operation well known in the art. Transistor 1 will conduct and a voltage will appear across terminals 10 and 11 until such time as transistor 1 is cut off. In order to control conduction in transistor 1 and determine the width of the output pulse, means are provided which cut off transistor 1 in accordance with a charge developed on the resistor-capacitor circuit of resistor 15 and capacitor 16. Transistor 18, normally cut off, has its base connected to be responsive to the charge on capacitor 16. Conduction in transistor 1 generates a voltage in the windings of transformer 2. The voltage fed back from feedback winding 12 through resistor 15 charges capacitor 16. That is, the upper plate of capacitor 16 starts going positive. When the charge on capacitor 16, which presents a voltage to the base of transistor 18, reaches a value equal to the forward voltage drop across diode 5 plus the forward conduction voltage drop at the base-emitter junction of transistor 18, transistor 18 conducts and its collector voltage goes negative. The base of transistor 1 correspondingly goes negative, thereby cutting off transistor 1 and terminating the output pulse at terminals 10 and 11.

The width of the output pulse at terminals 10 and 11 is determined by the resistor-capacitor circuit of resistor 15 and capacitor 16, the B+ voltage, the base-emitter voltage junction of transistor 18, and the forward bias drop across diode 5. Upon initiation of an input pulse at terminal 7, a leading edge of the pulse output is determined at terminals 10 and 11. The time it takes the voltage on capacitor 16 to rise to the conduction point of transistor 18 determines the trailing edge. The equation for the output pulse duration may be stated as $$T=RC\ln\left(\frac{V}{V-v}\right)$$

wherein T is the time, R is the value of resistance 15, C is the value of the capacitor 16, V is the value of the voltage induced across winding 12, and $v$ is the value of the voltage between the base of transistor 18 and ground which causes transistor 18 to conduct. The characteristics of transistor 1 and transformer 2 have no effect on the width of the output pulse. Thus, it may be seen from the above that the width of the output pulse at terminals 10 and 11 is dependent entirely on parameters which are independent of the transformer and transistor parameters of the blocking oscillator. In this manner a pulse output of highly accurate width may be produced.

Referring now to FIG. 2 there is shown typical waveforms of the circuit of FIG. 1. In FIG. 2*a* a positive input pulse at terminal 7 has a leading edge at time $t_0$ and a trailing edge at time $t_1$. The voltage at the base of transistor 1, illustrated in FIG. 2*b*, rises to the positive level of the input pulse at $t_0$ causing conduction in transistor 1 and generating the leading edge of the output pulse across terminals 10 and 11, illustrated in FIG. 2*d*. The base of transistor 1 is maintained positive even after time $t_1$ when the input pulse terminates by action of the feedback circuit from winding 12 through resistor 13. Therefore, the output pulse (FIG. 2*d*) remains positive after time $t_1$. Also at time $t_0$ the voltage fed back from winding 12 to the resistor-capacitor circuit of resistor 15 and capacitor 16 causes the voltage on the upper plate of capacitor 16 to rise toward positive as illustrated in FIG. 2*c*. At time $t_2$, the voltage on capacitor 16 has risen the predetermined conduction level $V_c$ causing transistor 18 to conduct and thereby causing the voltage at the base of transistor 1 (FIG. 2*b*) to go negative. Transistor 1 cuts off and the trailing edge of the output pulse at terminals 10 and 11 is generated.

A wide range of pulse widths may be generated by the device of this invention by varying any of the values listed in the above noted equation. For example, as shown in FIG. 1, resistor 15, being variable, may be regulated to produce any desired output width. The width of the output pulse at terminals 10 and 11 is in no way dependent on the width of the input pulse and may be of any range desired.

In the embodiment of the invention in order to improve the quality of the output waveform, transformer 2 may be selected from ferrite or steel core material with the ratio of turns in the primary, secondary, and feedback windings being 1:1:1 for example. Resistor 15 may be a variable resistor varying up to 20,000 ohms. Storage capacitor 16, which together with resistor 15, controls the output pulse width, may be, for example, .001 microfarads. A B+ voltage of 28 volts may be selected. Diodes 4 and 5 may be of the type having a forward voltage drop of approximately 0.6 volts. Input capacitor 8 may be approximately 100 micromicrofarads. Resistors 6 and 13 may be of 20,000 ohms.

Although only a preferred embodiment of the invention has been described, it is noted that the disclosed circuit is capable of modification without departing from the scope of the invention. For example, transistors 1 and 18, shown as of the NPN type, could easily be of the PNP type with modifications well known to those skilled in the art. Additionally, circuit values could be of any value consistent with design requirements to produce an output pulse of varying widths. The range of pulse widths which may be generated is limited only by the frequency response of the components at the upper end and by the characteristics of transformer 2 at the lower end. Additionally, as shown in the drawing, an input pulse is applied to the base of transistor 1. If desired, an input pulse could be applied to the emitter of transistor 1 by means well known in the blocking oscillator art.

Although the invention has been described and illustrated in detail, it is to be clearly understood that the same is by way of illustration and example only and is not to be taken by way of limitation, the spirit and scope of this invention being limited only by the terms of the appended claims.

I claim:

1. A monostable blocking oscillator comprising an electron valve having a first electrode, a second electrode, and a control electrode, said control electrode connected to be responsive to input trigger pulses for initiating conduction in said electron valve, a primary winding connected to said second electrode, a secondary winding inductively coupled to said primary winding, a first current path including a resistor for coupling said secondary winding to said control electrode to feed back to said control electrode at least a portion of the voltage developed across said primary winding for maintaining conduction in said electron valve, and a second current path for connecting said secondary winding to said control electrode for cutting off conduction in said electron valve, said second current path comprising a second electron valve having at least a first electrode, a second electrode, and a control electrode, said second electrode of said second electron valve being connected to the control electrode of said first electron valve and said first electrode of said second electron valve being connected to the first electrode of said first electron valve, a time delay means having an input sensitive to at least a portion of the voltage developed across said secondary winding and having an output which is delayed in time a predetermined amount from said sensed input voltage, said time delay means having its input responsively connected to said secondary winding and its output connected to said control electrode of said second electron valve; the control electrode of said second electron valve being responsive to the output of said time delay means for terminating conduction in said first electron valve.

2. The combination recited in claim 1 wherein said time delay means includes a resistor-capacitor circuit said capacitor connected to be charged by at least a portion of the voltage developed across said secondary winding, and said resistor connected to control the charge time of said capacitor, the control electrode of said second electron valve being connected to be responsive to the charge on said capacitor.

3. A monostable blocking oscillator comprising in combination; an oscillator transistor having at least a collector, a base, and an emitter, a source of direct-current potential, a primary winding connected between the positive side of said direct-current source and said collector, a secondary winding inductively coupled to said primary winding, a resistor connecting said secondary winding to said base to feed back to said base a portion of the voltage developed across said secondary winding for maintaining conduction in said oscillator transistor, a resistor-capacitor circuit connected between said secondary winding and the negative side of said direct-current source, said resistor-capacitor circuit including at least one resistor and capacitor connected serially, said capacitor also being connected to be charged by at least a portion of the voltage developed across said secondary winding, and switch means responsive to the charge on said capacitor for cutting off conduction in said oscillator transistor.

4. The combination recited in claim 3 wherein said means for cutting off conduction in said oscillator transistor comprise a control transistor having at least a collector, an emitter, and a base, the collector-emitter circuit of said control transistor being connected between the base of said oscillator transistor and the negative side of said direct-current source, the base of said control transistor being responsive to said resistor-capacitor circuit for controlling conduction in said control transistor whereby conduction in said control transistor causes said oscillator transistor to terminate conduction.

5. A blocking oscillator comprising an oscillator transistor having at least a collector, a base, and an emitter, a source of direct-current potential, a primary winding connected between the positive side of said direct-current source and said collector, a secondary winding inductively coupled to said primary winding, a feedback resistor serially connecting said base and said secondary winding for feeding back to said base at least a portion of the voltage developed across said primary winding for maintaining conduction in said oscillator transistor, a resistor and a capacitor connected in series between said secondary winding and the negative side of said direct-current source, a control transistor having at least a collector, a base, and an emitter electrode, the collector-emitter circuit of said control transistor being connected between the base of said oscillator transistor and the negative side of said direct-current source, said control transistor terminating conduction in said oscillator transistor when said control transistor is conducting, the base of said control transistor being connected to the junction of said resistor and said capacitor for initiating conduction in said control transistor when the charge on said capacitor reaches a predetermined value.

6. A blocking monostable oscillator comprising a first electron valve having a first electrode, a second electrode, and a control electrode, a transformer primary winding connected to said second electrode, a transformer secondary winding inductively coupled to said primary winding, means for coupling said secondary winding to said control electrode to feed back to said control electrode at least a portion of the voltage developed across said primary winding for causing conduction in said first electron valve, and switch means for cutting off conduction in said first electron valve, a time delay means connected to said secondary winding for sensing at least a portion of the initial voltage on said secondary winding and supplying an output delayed in time from said initial secondary voltage, said switch means including a second electron valve responsively connected to the output of said time delay means, said second electron valve being connected to said first electron valve to control conduction of said first valve.

7. A monostable blocking oscillator comprising in combination: an electron valve having at least a first electrode, a second electrode, and a control electrode, said control electrode connected to be responsive to input trigger pulses for initiating conduction in said electron valve; a primary winding connected to said second electrode; a secondary winding inductively coupled to said primary winding; a current path coupling said secondary winding to said control electrode to feed back to said control electrode at least a portion of the voltage developed across said primary winding for controlling conduction in said electron valve; switch means having an "on" condition and an "off" condition, responsively connected to said control electrode, conduction being maintained in said electron valve when said switch means is in said "off" condition, and conduction being prevented in said electron valve when said switch menas is in said "on" condition; time delay means responsively connecting said secondary winding to said switch means, said time delay means being adapted to hold said switch means in the "off" condition for a pre-determined length of time after initial conduction, and to thereafter hold said switch means in the "on" condition.

8. The combination recited in claim 7 wherein said switch means comprises a second electron valve connected to be controlled in conduction by said time delay means.

9. The combination recited in claim 7 wherein said time delay means comprises in combination: a resistor, and a capacitor, said capacitor connected to be charged by at least a portion of the voltage developed across said secondary winding, and said resistor connected to control the charge time of said capacitor, said switch means connected to be controlled by the charge on said capacitor.

References Cited in the file of this patent

UNITED STATES PATENTS

| | | |
|---|---|---|
| 2,562,228 | Atwood | July 31, 1951 |
| 2,999,172 | Lawrence | Sept. 5, 1961 |
| 3,061,795 | Byrd et al. | Oct. 30, 1962 |